United States Patent
Hyde et al.

(10) Patent No.: US 7,667,231 B2
(45) Date of Patent: Feb. 23, 2010

(54) AUTOMATIC ON-DIE DEFECT ISOLATION

(75) Inventors: John D. Hyde, Corvallis, OR (US); Jay A. Kuhn, Seattle, WA (US); Ronald L. Koepp, Lynnwood, WA (US); Ronald E. Paulsen, Woodinville, WA (US)

(73) Assignee: Impinj, Inc., Seattle, WA (US)

( * ) Notice: Subject to any disclaimer, the term of this patent is extended or adjusted under 35 U.S.C. 154(b) by 282 days.

(21) Appl. No.: 11/336,161

(22) Filed: Jan. 20, 2006

(65) Prior Publication Data

US 2007/0172966 A1 Jul. 26, 2007

(51) Int. Cl.
*H01L 23/58* (2006.01)
(52) U.S. Cl. .................... 257/48; 257/207; 257/208; 257/209; 257/E23.146; 257/E23.179
(58) Field of Classification Search .................. 257/48, 257/203, 204, 207–209, 529, E23.146, E23.149, 257/E23.179
See application file for complete search history.

(56) References Cited

U.S. PATENT DOCUMENTS

| | | | | |
|---|---|---|---|---|
| 4,210,875 A | * | 7/1980 | Beasom | 330/261 |
| 6,157,066 A | * | 12/2000 | Kobayashi | 257/363 |
| 6,753,547 B2 | * | 6/2004 | Devereaux | 257/48 |
| 7,307,528 B2 | | 12/2007 | Glidden et al. | |
| 7,312,622 B2 | | 12/2007 | Hyde et al. | |
| 7,380,190 B2 | | 5/2008 | Hara et al. | |

* cited by examiner

*Primary Examiner*—Matthew E Warren
(74) *Attorney, Agent, or Firm*—Blakely Sokoloff Taylor & Zafman LLP

(57) ABSTRACT

Microcircuits may include polysilicon features that are vulnerable to defects due to undesirable phenomena during manufacturing processes such as, inter alia, over-etching. The same phenomena that may cause defects can be exploited to automatically isolate the affected circuit and thus limit the harm caused by defects or incipient defects.

19 Claims, 15 Drawing Sheets

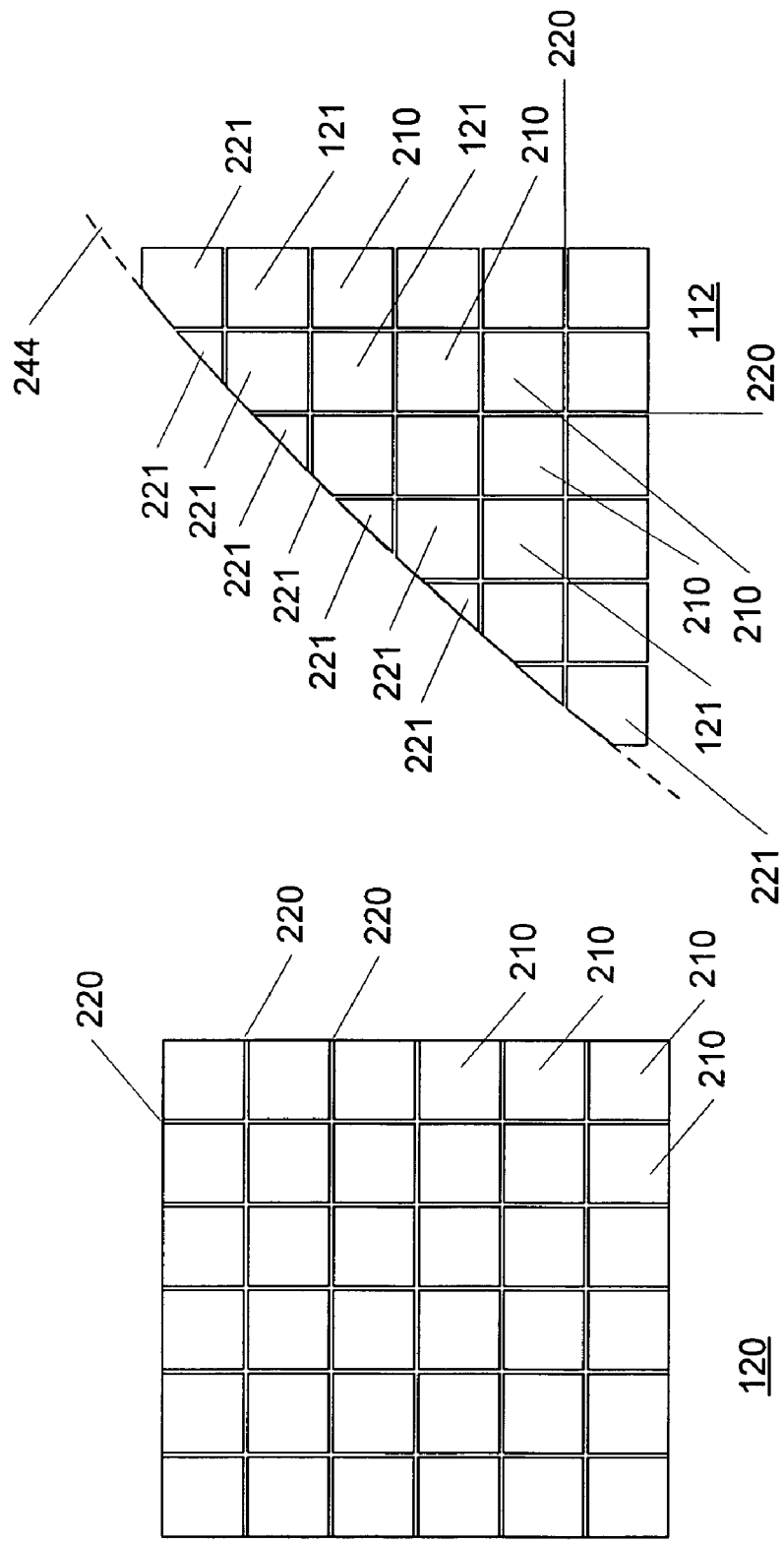

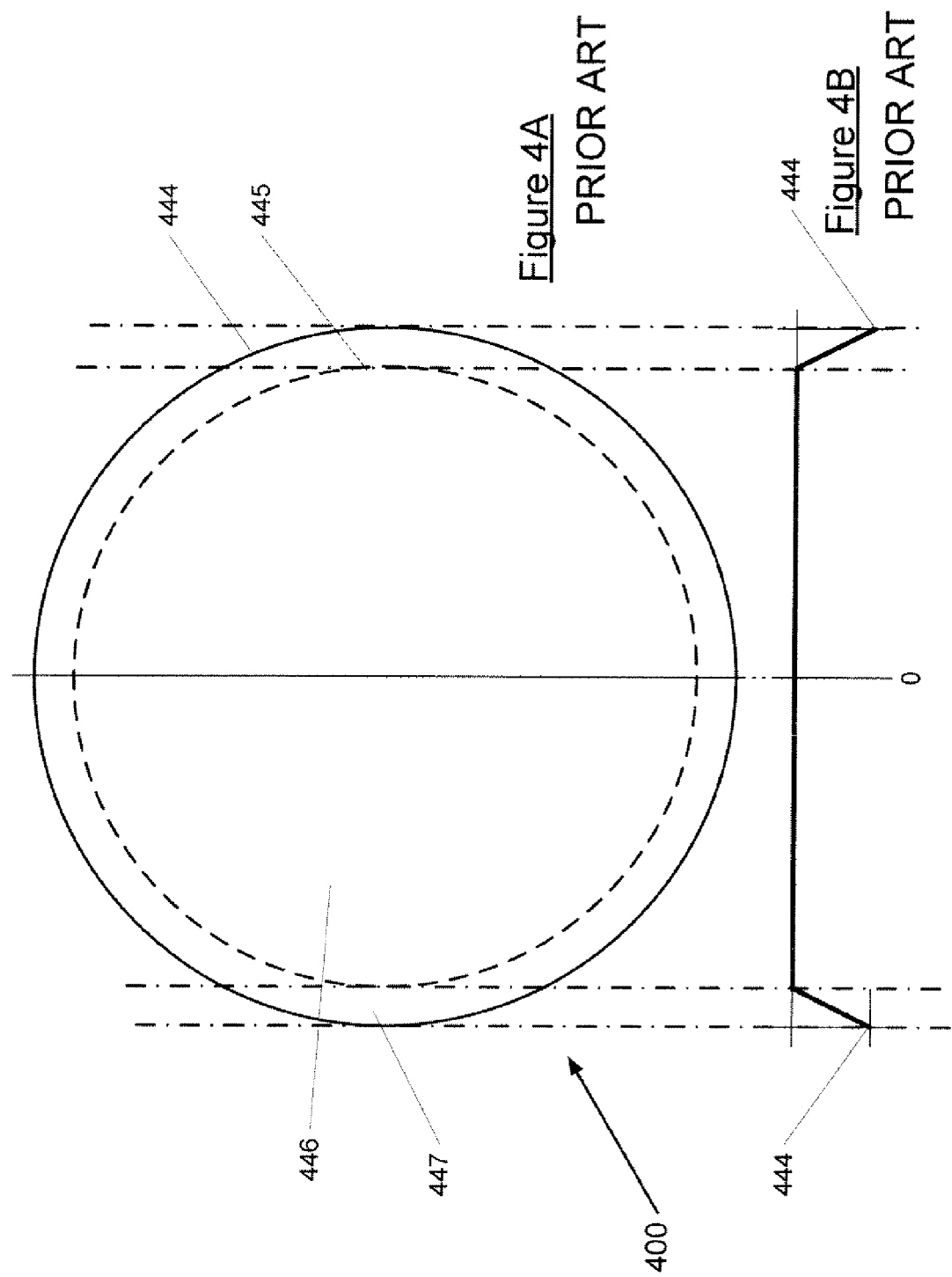

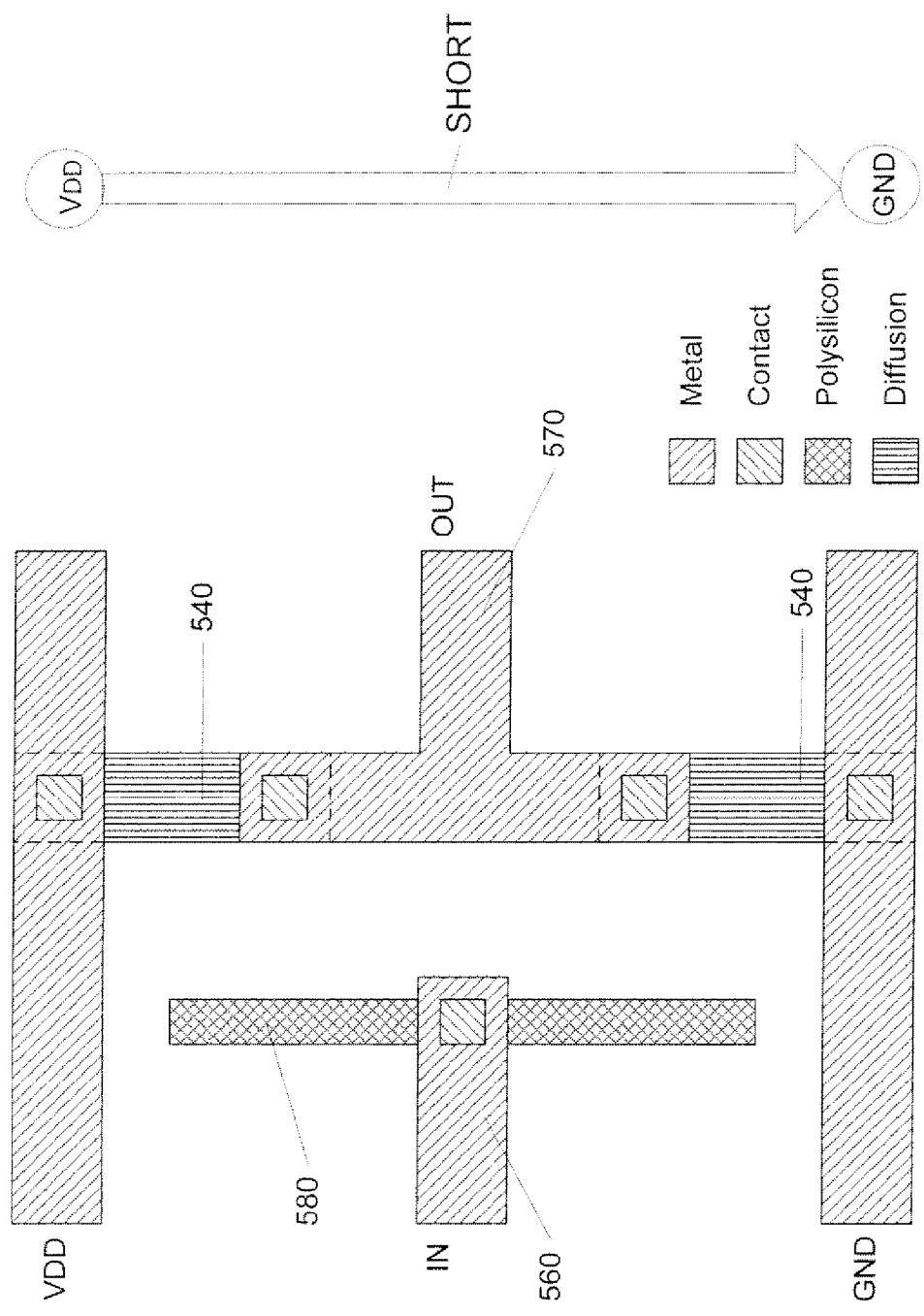

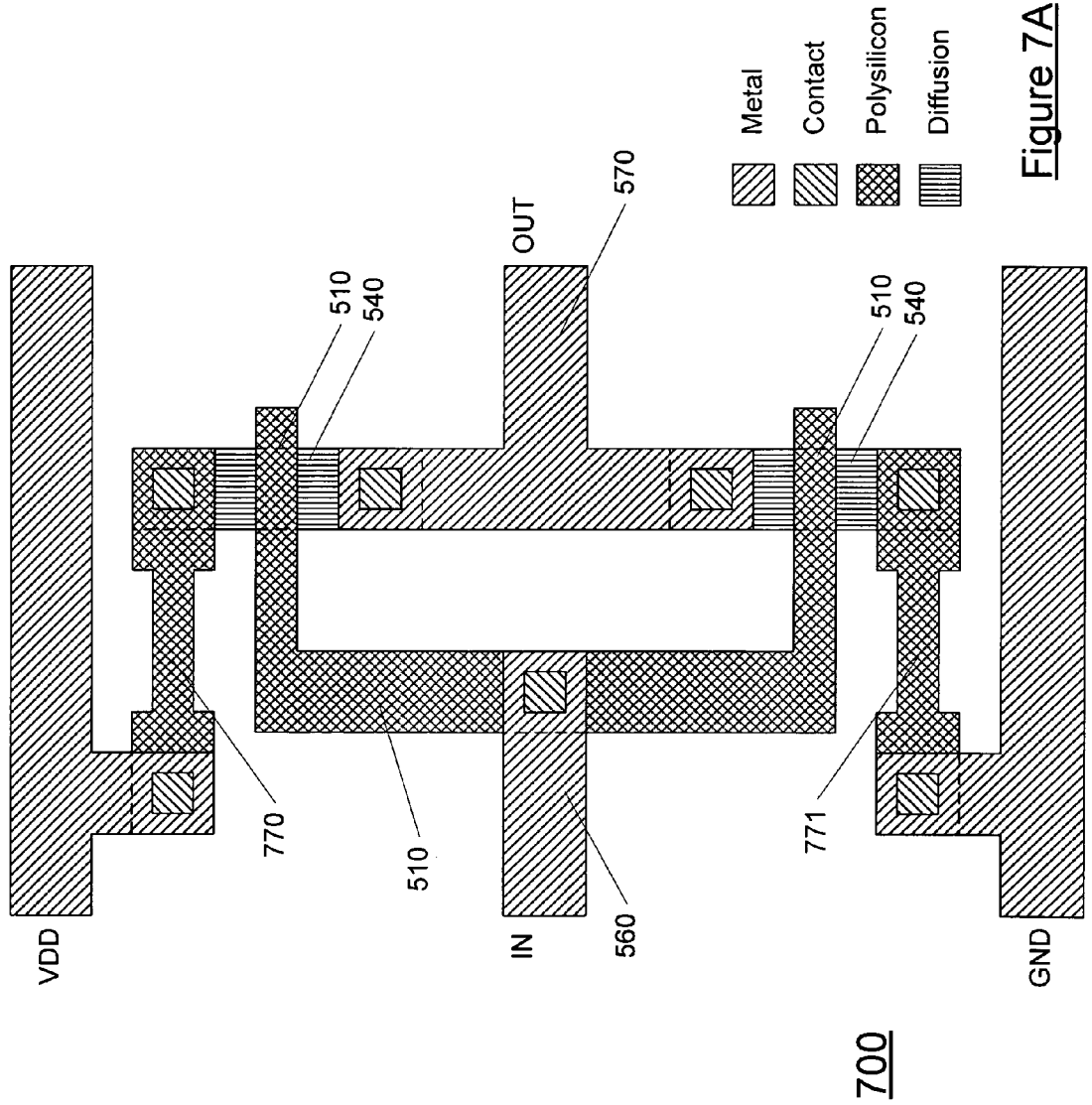

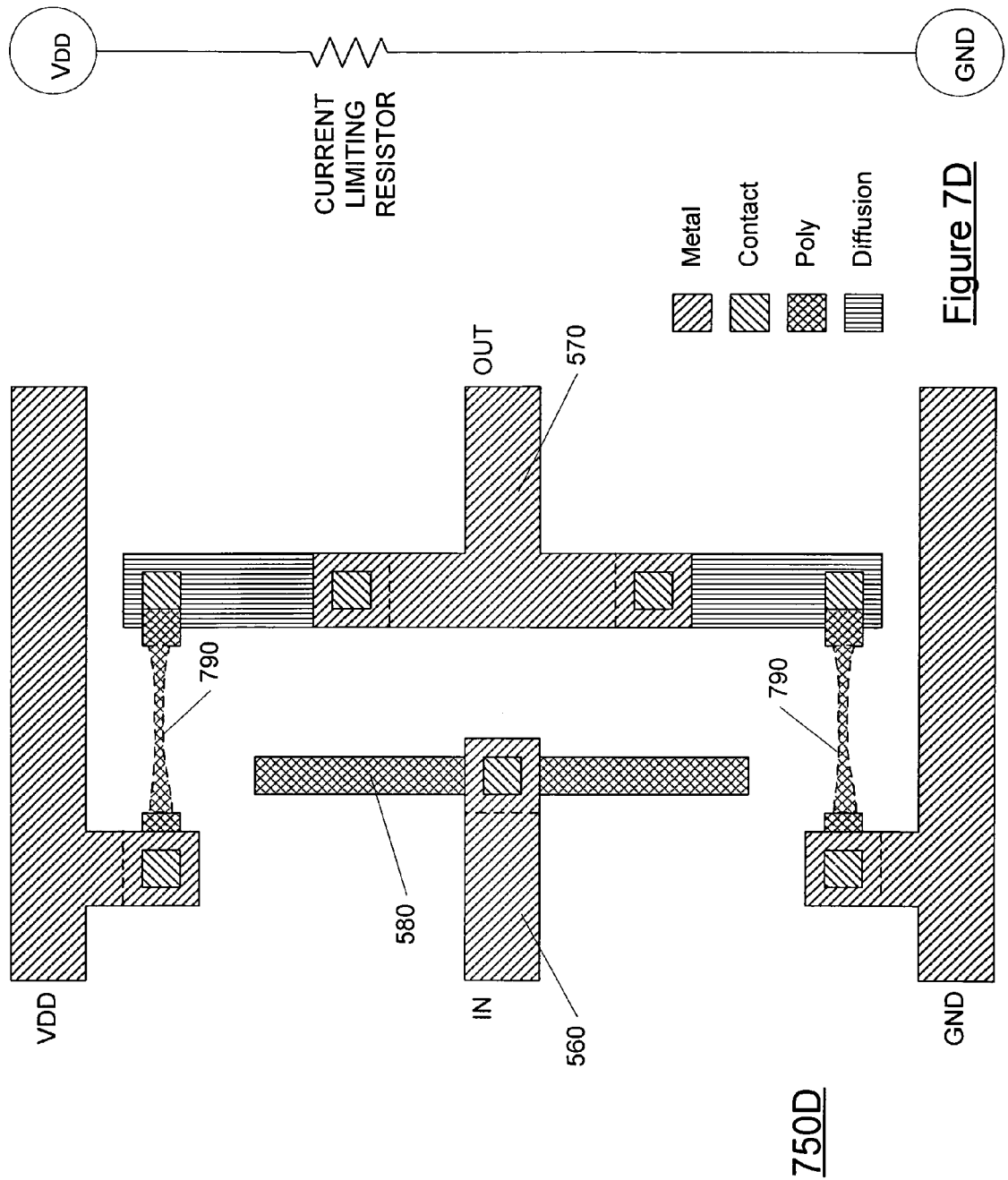

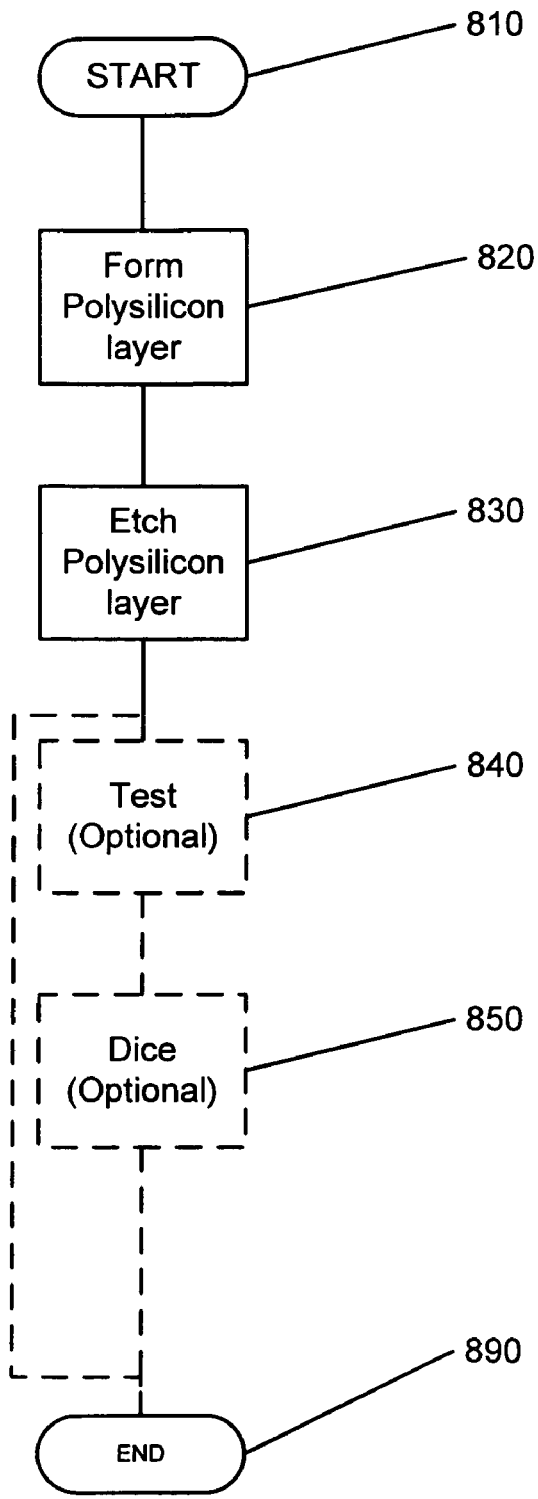
800  Figure 8

AUTOMATIC ON-DIE DEFECT ISOLATION

FIELD OF THE INVENTION

The field of invention relates to the semiconductor chip arts; and, more specifically, to the embodiment of design techniques that may result in increased yield and/or other benefits during manufacture.

BACKGROUND OF THE INVENTION

Integrated circuit (IC) manufacturers produce dice containing circuits on typically circular substrates referred to as semiconductor wafers. Each individual die may be of rectangular or square shape and a wafer may contain hundreds of them. The unsingulated dice on a wafer, (i.e. each unsingulated die), must ordinarily be tested to determine good from bad before the dice are singulated in order to manage cost and yield.

The use of photolithography with etching is well-known and commonplace in semiconductor wafer fabrication. A single photo-mask may be used with a stepper to create multiple (more or less) identical reticles—clusters of circuits that often contain more than one substantially identical unsingulated die. Thus a set of masks (often one per layer) for a reticle may include a plurality of circuit images, including images of application circuit components and elements. Each die will typically contain one or more application circuits composed of many circuit elements (such as gates, channels, lines etc.)

Because a typical circuit cluster, sometimes termed a "reticle", includes more than one unsingulated die it is often advantageous to expose a partial (i.e. incomplete) reticle, such as at the wafer edge. This applies even though it is known that only some (at most) of the dice etched will ultimately be usable in products. A significant problem arises wherein systemic defects within a reticle but outside a particular unsingulated die impede the testing of that otherwise good unsingulated die.

Thus, there is a need for improved defect isolation in regards to semiconductor die fabrication. Benefits may include increased average yield for a fabrication process and/or improved reliability of the finished product (such as by eliminating marginal dice that might otherwise have passed testing).

Although embodiments of the invention were developed to address and remedy a particular class of wafer defects, the benefits of the invention may be expected to find a wider usage and utility and may extend far beyond solving the problem that originally motivated the invention.

BRIEF DESCRIPTION OF THE DRAWINGS

The present invention is illustrated by way of example and not limitation in the figures of the accompanying drawings, in which like references indicate similar elements and in which:

FIGS. 2A and 2B show a symbolic representation of complete and incomplete dice within a single reticle of a semiconductor wafer.

FIG. 4A shows a plan view of a semiconductor wafer manifesting a manufacturing issue or problem.

FIG. 4B shows a graph of after-etching notional polysilicon line width for the semiconductor wafer of FIG. 4A.

FIG. 5C represents the microcircuit structure of FIG. 5B without the removed components, which therefore causes a short circuit.

FIG. 7A represents a CMOS microcircuit embodied on a wafer according to an embodiment of the invention.

FIG. 7D represents a microcircuit structure according to another embodiment of the invention.

FIG. 8 is a flowchart of a method for manufacturing a semiconductor wafer according to an embodiment of the invention.

DETAILED DESCRIPTION OF THE INVENTION

Figure 1A:
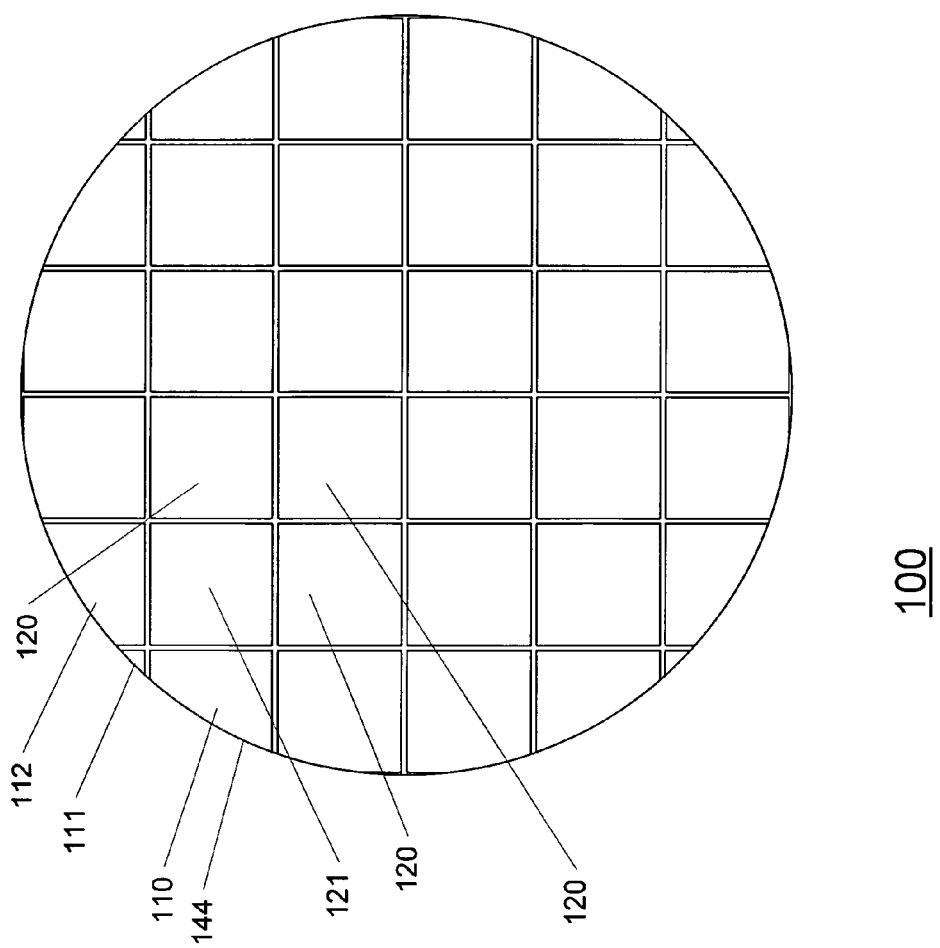
FIG. 1A shows a plan view of a semiconductor wafer according to an embodiment of the invention.

FIG. 1A shows a plan view of a semiconductor wafer 100 having a circular edge 144. Semiconductor wafer 100 may typically contain a number of complete reticles 120, 121 as well as a number of partial reticles 110, 111 and 112.

Figure 1B:
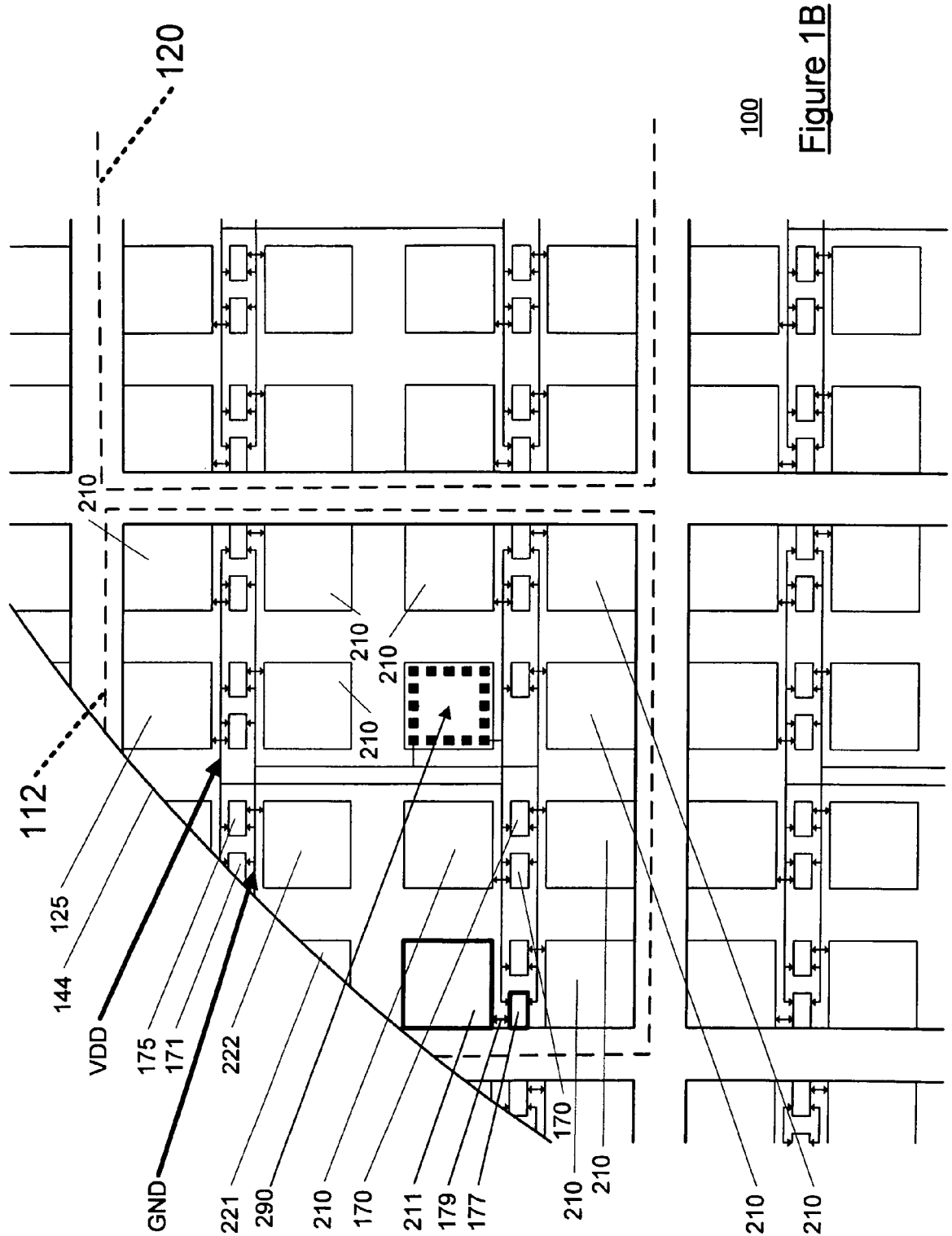
FIGS. 1B and 1C show close-up views of part of the semiconductor wafer of FIG. 1A.

FIG. 1B shows a close-up view of part of the semiconductor wafer 100 of FIG. 1A bounded by edge 144. As shown, semiconductor wafer 100 may contain one more complete reticles 120, and at least one partial reticle 112. Partial reticle 112 is shown as containing a number of complete die 210, 222 a partial die 221 and a marginally complete die 125. Also shown are two power rails ($V_{DD}$ and GND) in the form of conductive traces and a set of probe pads 290. On-wafer test circuits 170, 171, 175 are also shown. In the exemplary reticle shown, each test circuit is associated with, and energizes precisely one unsingulated die. For example, test circuit 177 energizes and drives unsingulated die 211 during testing by impressing signals on conductive traces 179. Test circuits, such as 175, will typically be discarded as scrap material during die singulation (not shown).

Still referring to FIG. 1B, as shown, $V_{DD}$ and GND connect probe pads 290 to on-wafer test circuits 170, 171, 175. Also (not shown) will be other similar conductive traces that also couple probe pads 290 to on-wafer test circuits 170, 171, 175.

Figure 1C:
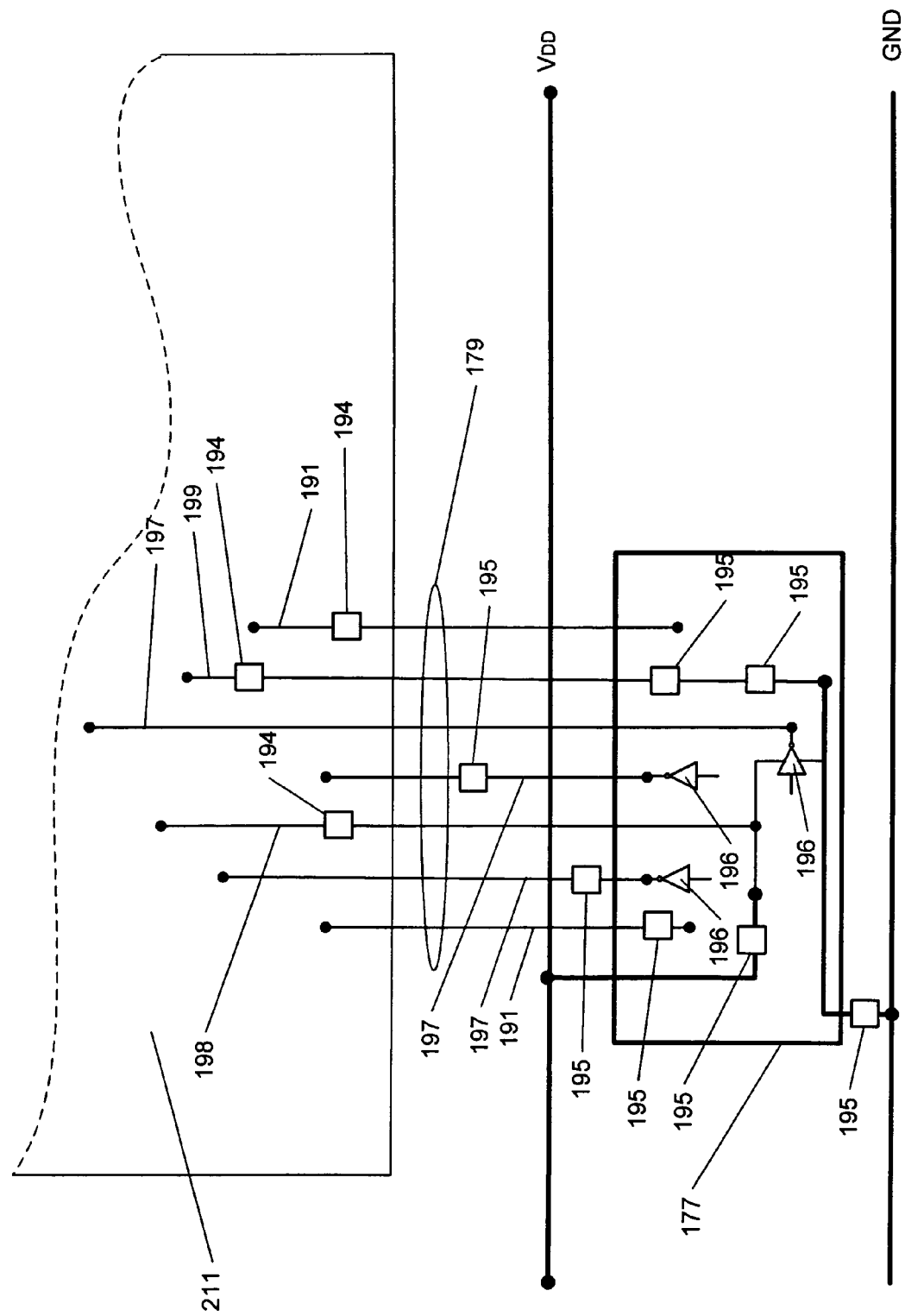

FIG. 1C shows a further close-up view of part of the semiconductor wafer of FIGS. 1A and 1B. As shown, on-wafer test circuit 177 is coupled to unsingulated die 211 (shown only in part in FIG. 1C) by conductive traces 179. Conductive traces 179 may include a ground rail 199, a fixed voltage power supply rail 198 and various other traces 191 including signal traces 197, such as may be driven by control circuitry 196. In embodiments of the invention, the traces 179 may be tailored to be purposefully narrowed (for purposes described below) at any of several points, off-die or on-die. Traces 197 may carry either inputs or outputs, such as clock, data, enable, etc. FIG. 1C includes examples of on-die narrowed traces (or narrowed regions) 194 and off-die narrowings 195.

Thus, pulling together the features of FIGS. 1A, 1B, 1C, under the control of an automated test system (not shown) that may impress programmed signals via probe pads 290, on-wafer test circuits may be used to generate on-wafer test sequences for a purpose of distinguishing good dice from bad prior to singulation. These on-wafer test sequences may generate various strobe signals and also constant or quasi-constant voltages at voltage nodes that are connected to conductive traces 179 including grounds, power rails and enable inputs.

FIGS. 2A and 2B show a symbolic representation of complete dice 210 and incomplete dice 221 within a single reticle of a semiconductor wafer. FIG. 2A shows a full reticle 120. FIG. 2B shows a partial reticle 112. Scribe lines 220 are shown and serve to guide dividing a reticle into singulated dice. In FIG. 2B, the pecked line 244 indicates the curved edge of the wafer which also forms part of the boundary of the partial reticle 112 and of the incomplete dice 221. Dice 121, though complete, are proximate to the edge of the wafer and so being can raise issues as discussed infra.

Figure 3:
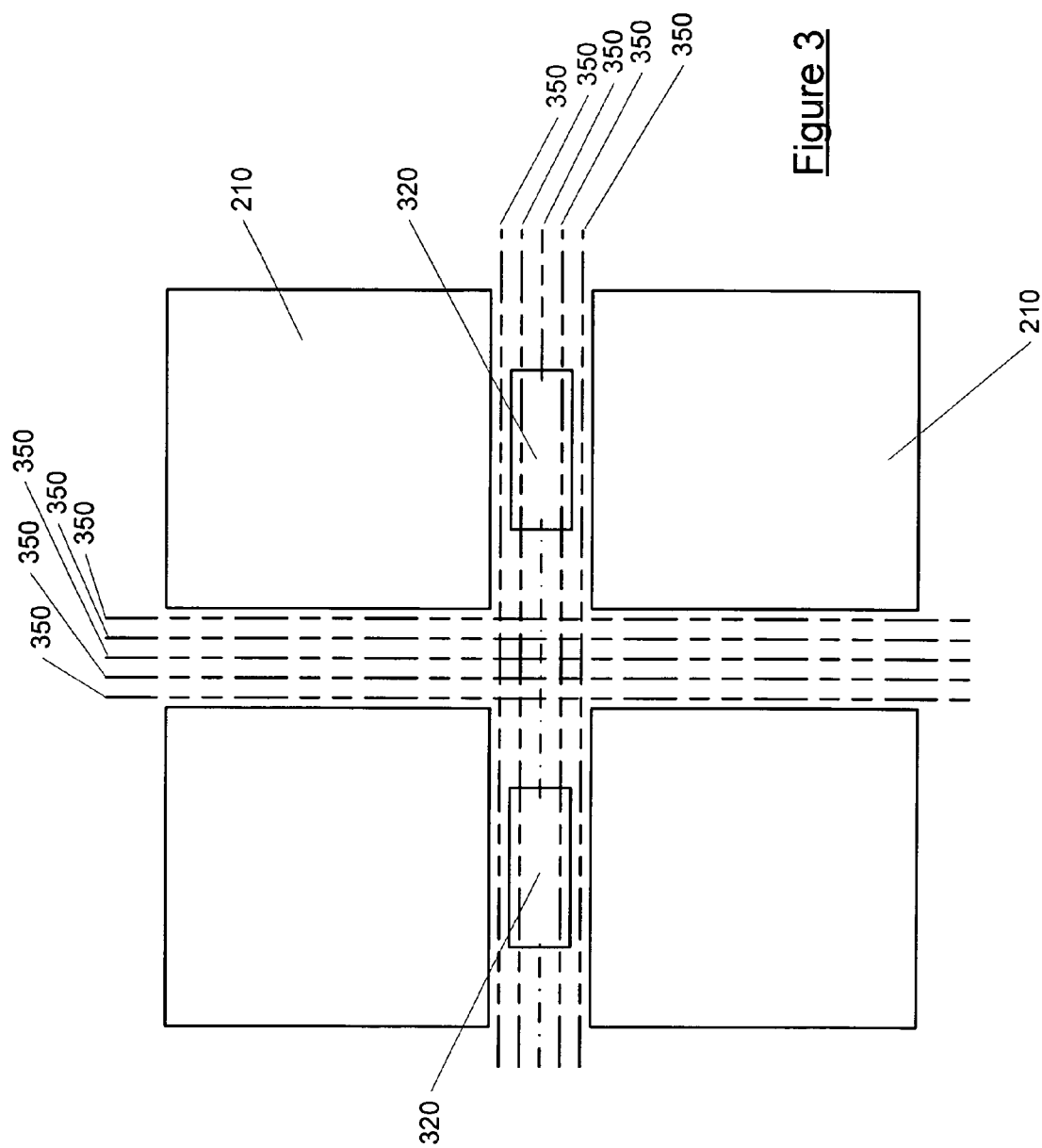
FIG. 3 shows a further close-up view of another part of the semiconductor wafer of FIG. 1A.

FIG. 3 shows a further close-up view of another part of the semiconductor wafer of FIG. 1A. Good unsingulated dice 210 are shown. Scribe lines 350 may be used in the singulation process. Also shown are two test circuits 320. These on-wafer but off-die test circuits 320 may be used to test the unsingulated dice 210, but since the scribe lines 350 run through the test circuits 320, the test circuits necessarily do not survive the singulation process and are discarded. Nor are these on-wafer test circuits 320 needed after die singulation.

FIG. 4A shows a plan view of a sample semiconductor wafer 400 manifesting a manufacturing issue or problem. An annular outer area 447 of the wafer adjoining the edge of the wafer 444 may be vulnerable to polysilicon over-etching due to a number of reasons, some of which may be photo-resist non-uniformity, photolithography inaccuracy, and so on. A large central portion 446 of the wafer bounded by a circle 445 is unaffected by the problem of polysilicon over-etching.

It is commonplace in the art to use polysilicon lines to create microcircuit conductive traces and other circuit elements, such as field-effect transistor (FET) gates, especially in Metal-Oxide semiconductor (MOS) technologies. The process typically involves etching a deposited polysilicon layer using photolithography with a mask and photo-sensitive etch resist. For whatever reasons, polysilicon lines near the edge of a wafer may be vulnerable to over-etching. Over-etching a polysilicon line will typically result in reduced width, and/or part or all of the line may disappear altogether.

FIG. 4B shows a graph of after-etching polysilicon line width (y-axis) across a diameter (x-axis) of the semiconductor wafer 400 of FIG. 4A. As shown in FIG. 4B, over the entire central portion of the wafer the resultant polysilicon line width holds a substantially consistent value meeting specifications. But towards the edge of the wafer 444, polysilicon line width is progressively reduced.

Figure 5A:
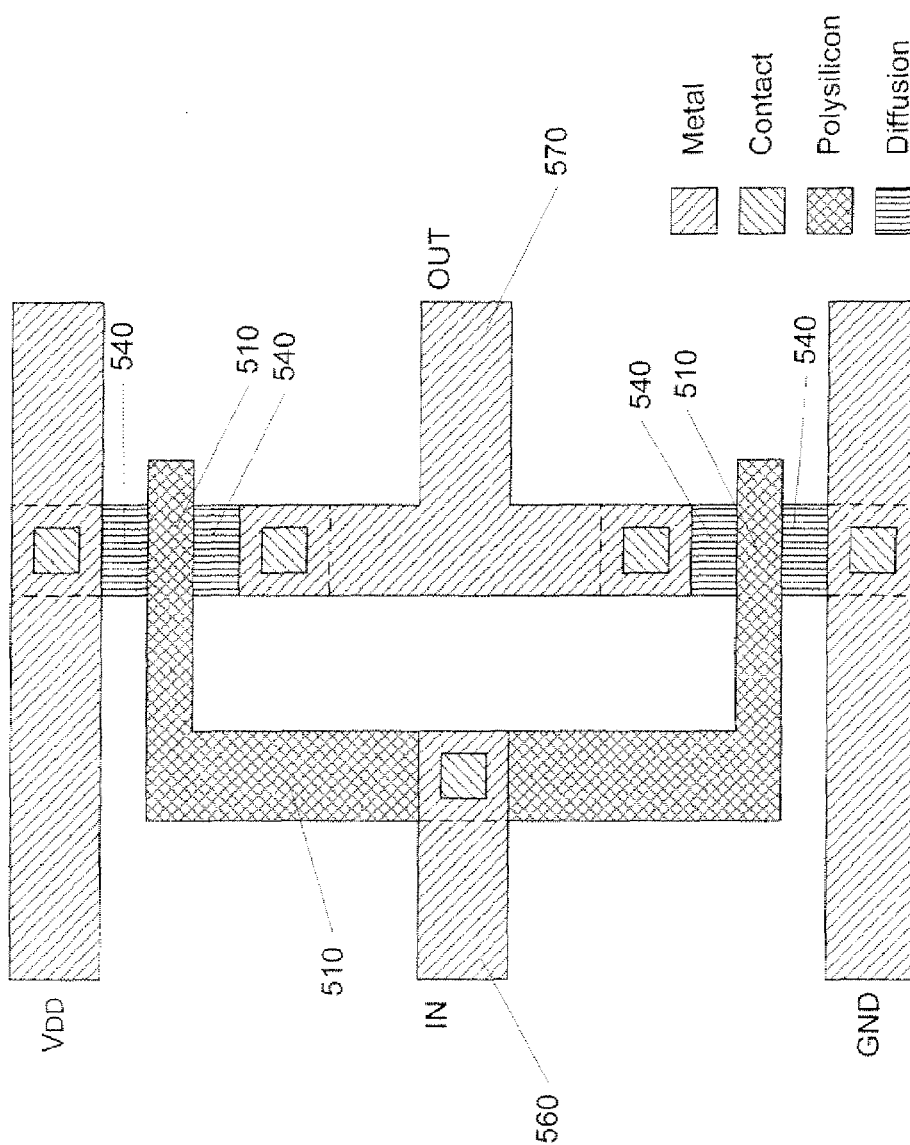
FIG. 5A represents a prior art CMOS microcircuit embodied near the edge of a wafer such as the wafer of FIG. 4A.

FIG. 5A represents a prior art Complementary MOS (CMOS) microcircuit 500 embodied on a wafer substrate, such as on the wafer of FIG. 4A. Such microcircuits may be used for many purposes including forming parts of tag circuits for RFID (Radio Frequency Identification Device) tags. As shown, $V_{DD}$ and GND are the conventional power rails formed as metallization. The microcircuit depicted in FIG. 5 may be a CMOS inverter. Signal IN port 560 and OUT port 570 may be formed as metallization. Complementary channel regions 540 operate gates formed as polysilicon lines 510 to provide the two FETs that formed the heart of the inverter circuit.

Figure 5B:
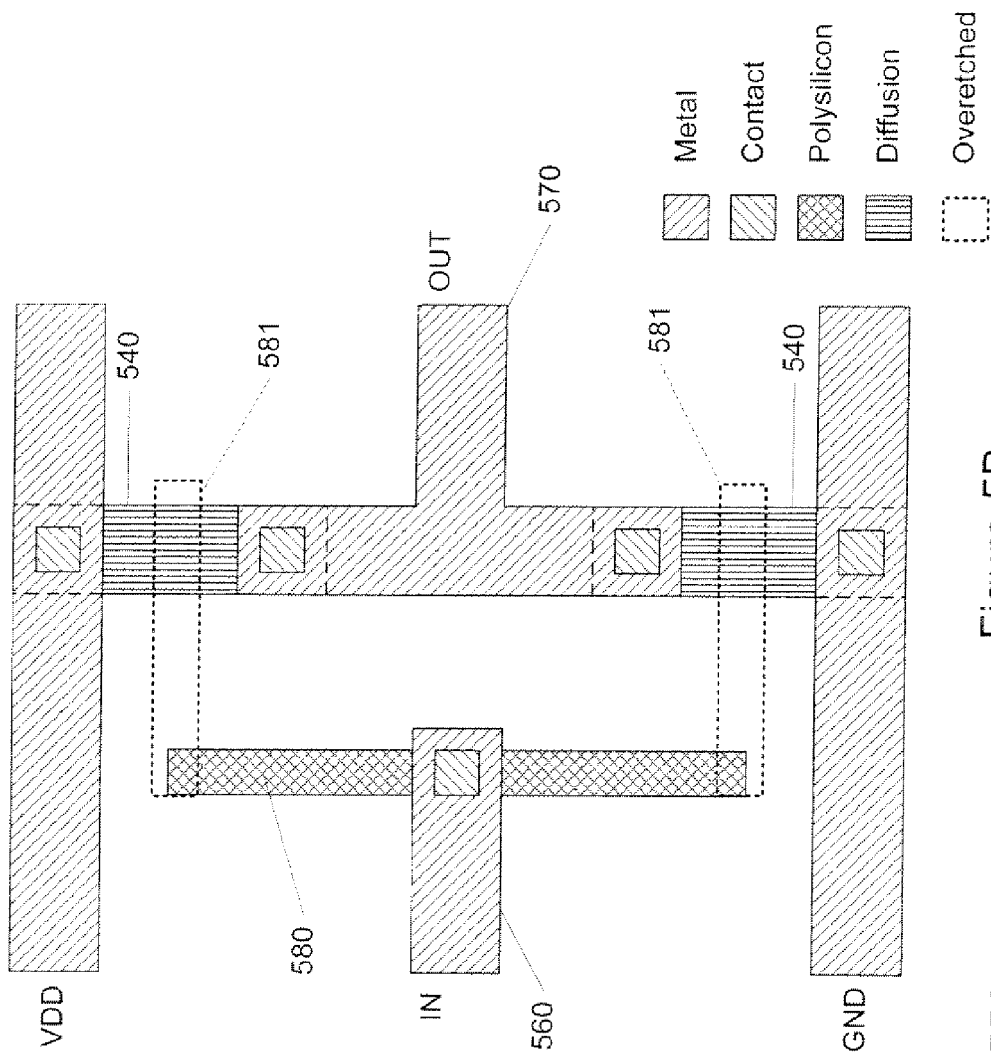
FIG. 5B represents the microcircuit structure of FIG. 5A, further showing from where components have been removed due to the effect described in conjunction with FIG. 4B.

FIG. 5B represents a microcircuit structure 550 similar to that 500 of FIG. 5A but formed near the edge of the wafer, further showing by pecked lines where components have been removed due to the effect described in conjunction with FIG. 4B. A defect illustrated by FIG. 5B is the result of polysilicon over-etching. Contrasting FIG. 5B with FIG. 5A it may be seen that the polysilicon line 580 is of reduced width due the over-etching and the FET gates 581 are missing altogether. Not only will this defect prevent the microcircuit from operating correctly but it will also conduct excessive current "SHORT" between the two power rails $V_{DD}$ and GND. This is, more or less, a short circuit condition that may cause other circuits that rely on the same $V_{DD}$ and GND rails to malfunction also.

Referring to both FIG. 1B and FIG. 5B, suppose that defective (short-circuited) microcircuit 550 is part of test circuit 175 or unsingulated die 222. In these circumstances, there is a significant risk that, since test circuit 175 energizes die 222 then the combination of test circuit 175 and die 222 will short the power rails $V_{DD}$ and GND together. If such a short-circuit happens then none of the good dice 170 on the partial reticle 112 may be testable prior to singulation and the entire partial reticle 112 may therefore be lost-even though it contains good dice 170. The need for defect isolation to improve manufacturing yield is self-apparent.

FIG. 5C represents the microcircuit structure of FIG. 5B without the removed components, which therefore causes a short circuit of microcircuit 550A between the power rails $V_{DD}$ and GND as shown.

Figure 6:
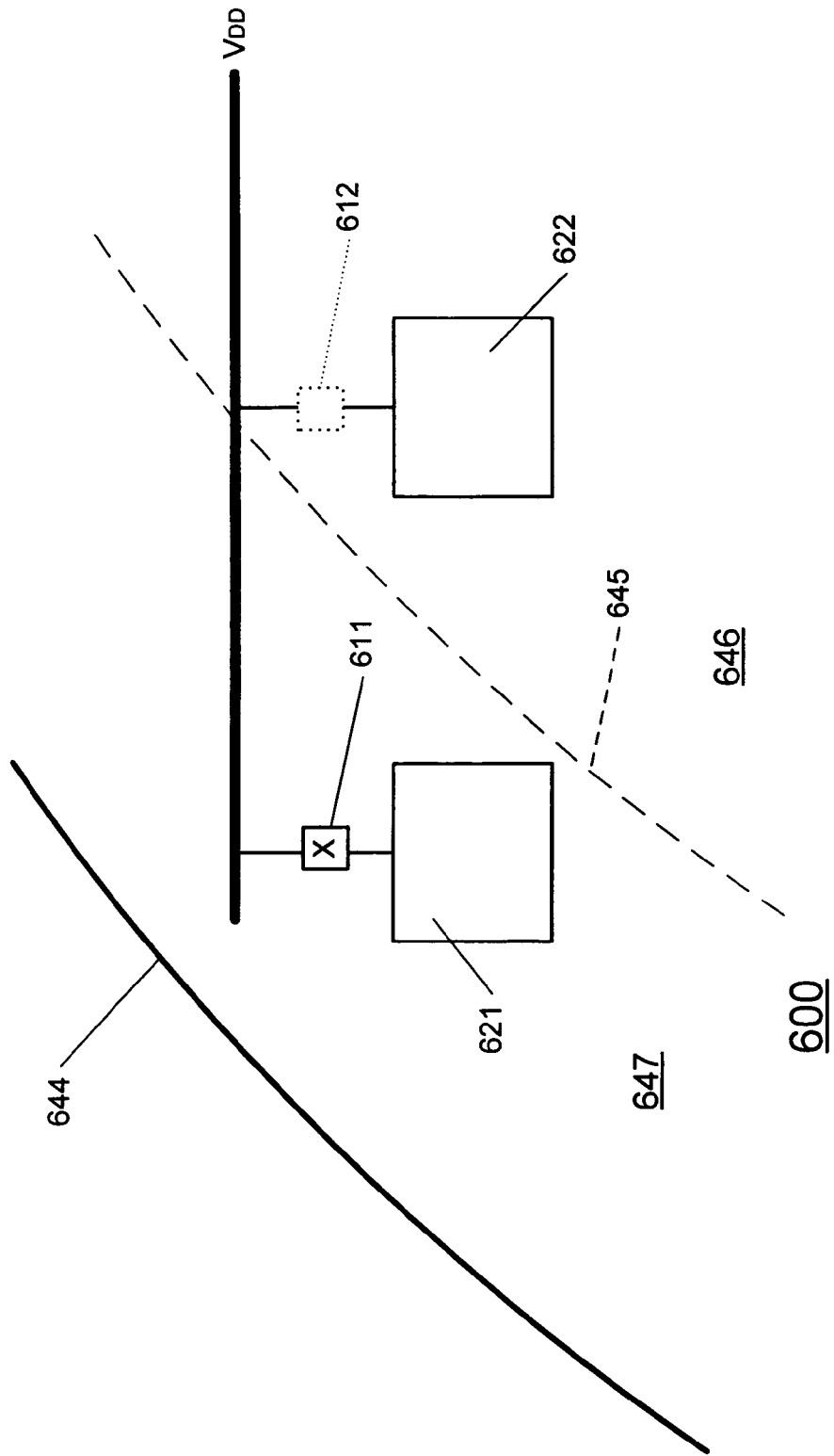
FIG. 6 shows a plan view of a part of a semiconductor wafer according to an embodiment of the invention.

FIG. 6 shows a plan view of a part of a semiconductor wafer according to an embodiment of the invention. In an embodiment, a circular boundary 645 may divide the wafer 600 into an overetched annular portion 647 and a non-over-etched central portion 646.

An isolated defective microcircuit structure 621 may be embodied on a wafer 600 having an edge 644 according to an embodiment of the invention. Over-etched polysilicon lines may be formed. However, the specialized conductive trace(s) 611 are also over-etched to the point of having more or less vanished; this results in an open-circuit at 611 which may function to isolate the defective circuit 621 from the $V_{DD}$ rail. Conductive trace(s) 612 (which may optionally be of the same specialized form) are not overetched, and so the good microcircuit structure 622 may be successfully tested since it is isolated from the short associated with defective microcircuit structure 621.

FIG. 7A represents a CMOS microcircuit 700 embodied on a wafer according to an embodiment of the invention. Contrasting FIG. 7A with FIG. 5A, the most obvious difference is the presence, in FIG. 7A, of additional polysilicon conductive traces 770 and 771 each with narrowed regions. The conductive traces with narrowed regions 770 and 771 are each connected to a power supply rail and may each function, in a working microcircuit, to energize the circuit by conducting current to or from a power supply voltage rail or ground. In a non-working circuit they may function as disconnect links to isolate the microcircuit from $V_{DD}$ and/or ground. Other embodiments of the invention may include a different number of conductors tailored to become disconnect links under certain conditions (for example just one).

The specialized conductive traces in microcircuits according to embodiments of the invention may serve a similar function to fuses in macro circuits. A purpose of specialized conductive traces is to isolate malfunctioning circuits. The conductive traces 770, 771 of the circuits of FIG. 7A are tailored, by design, to be at least as vulnerable to over-etching as the microcircuit that they are intended to isolate. For example if, in the circuit of FIG. 7A, the polysilicon line 510 embodying FET gates were to be over-etched then either or both of the specialized conductive traces 770, 771 would in all likelihood become open-circuit also. Thus, taken as a whole, if the circuit were malformed it would more likely be open-circuit than short-circuit. Although the microcircuit is non-functional either way (short-circuit or open-circuit), failure open-circuit would tend to isolate the defect and so improve average yield as described above. In contrast, failure short-circuit would tend to interfere with the operation of neighboring microcircuits merely sharing the same power rails and thus fail to isolate the defect.

Disconnect links may loosely be termed "fuses" by analogy with similarly purposed components in circuits which rely on fusion to create circuit disconnects. Although conductor fusion is not a particular feature of the present invention the absence of conductor fusion is not a requirement.

In order to embody the invention various approaches may be used to ensure that the specialized conductive traces do indeed disconnect whenever the protected application circuit is over etched. For example, the specialized conductive trace may be formed as a polysilicon line of width or thickness that has been tailored to be purposefully more narrowed in either width or thickness (or both) as compared with conductors in other parts of the circuit thus increasing the relative vulnerability to over-etching of the specialized conductive trace. The line width, embodied such as through photolithography may thus be tailored to have a sufficiently narrowed width that results in this desired greater vulnerability to over-etching.

Alternatively, since over-etching tends to occur near the edges of a wafer, and referring again to FIG. 4B, it will readily be apparent that a gradient of over-etching may occur across a reticle. This can render it advantageous to provide two specialized conductive traces (as in FIG. 7A), rather than merely one. If both a first and second specialized conductive trace is provided and one of them is on each side of the polysilicon circuit element being protected, then there is an improved chance that at least one conductive traces will be more vulnerable to over-etching than the circuit element it protects. The circuit layout, embodied such as through photolithography may thus be tailored to have a layout that results in this desired greater vulnerability to over-etching for the disconnect link(s).

There is also an issue as to whether the narrowed conductive traces (used as disconnect links) should be placed on the die or off the unsingulated die (but still on the wafer, typically in a test circuit that is discarded in a later manufacturing stage). The circuit of FIG. 7A could apply to either on-die or off-die placement.

For on-die placement, a die may typically comprise an application circuit that includes power rails (conductors), an active circuit and one or more disconnect links. Again typically the disconnect link(s) would be connected between the active circuit and the power rail(s), thus so as to be able to isolate the active circuit from one or more power rails should the manufacture be defective (typically by over-etching). Advantages of on-die placement may include a closer proximity between the disconnect link and the active circuit being protected. Disadvantages may include increased area in the completed die and the possible need to revise a microcircuit that is already proven reliable. It is well known in the art that there is no such thing as a circuit revision that is free of risk.

Figure 7B:
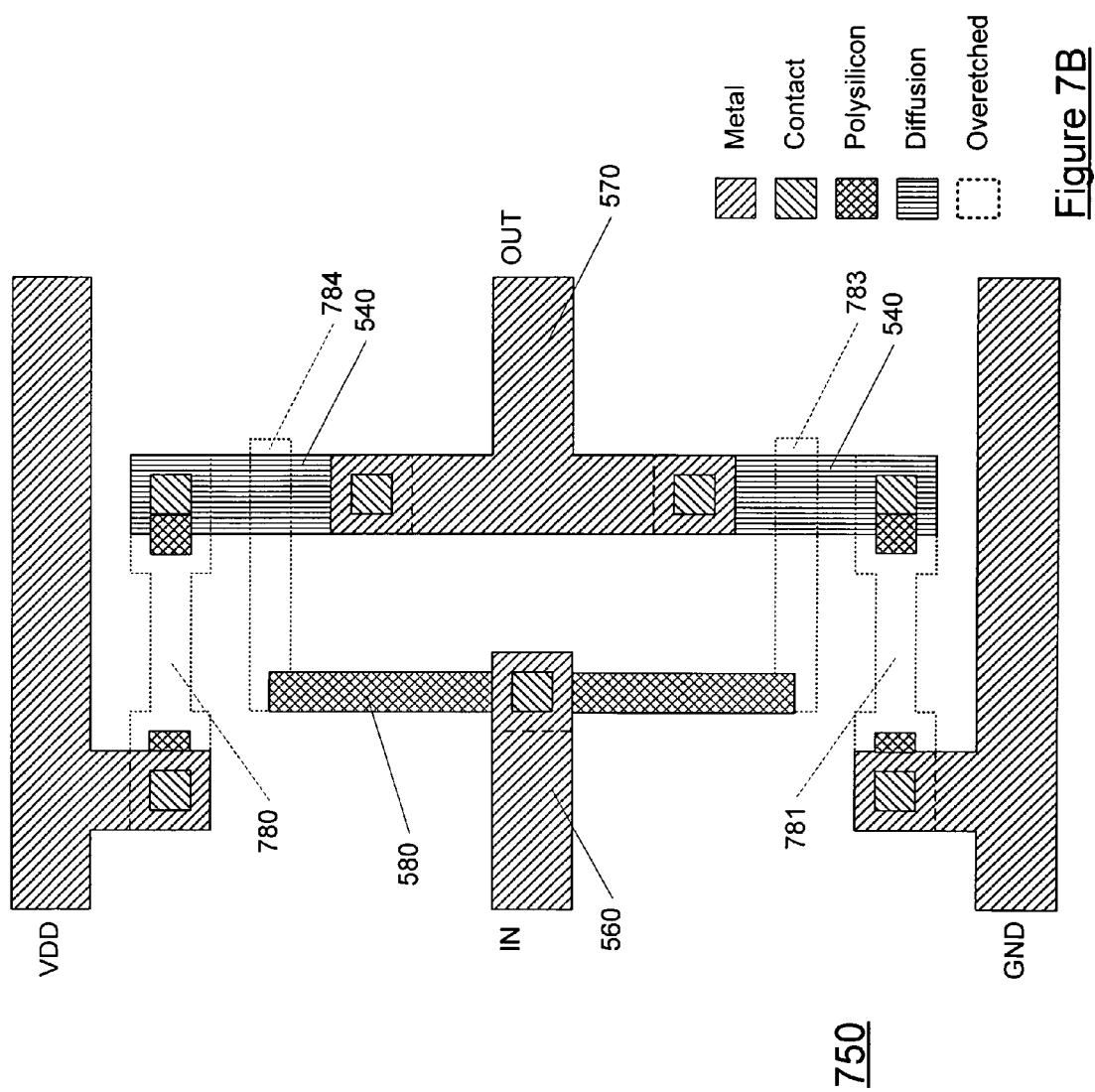
FIG. 7B represents the microcircuit structure of FIG. 7A, further showing from where components have been removed due to the effect described in conjunction with FIG. 4B according to an embodiment of the invention.

FIG. 7B represents the microcircuit structure of FIG. 7A, further showing from where components have been removed due to the effect described in conjunction with FIG. 4B according to an embodiment of the invention. In microcircuit structure 750, disconnect links 780, 781 are substantially absent due to over-etching and gates 783, 784 are entirely absent.

Figure 7C:
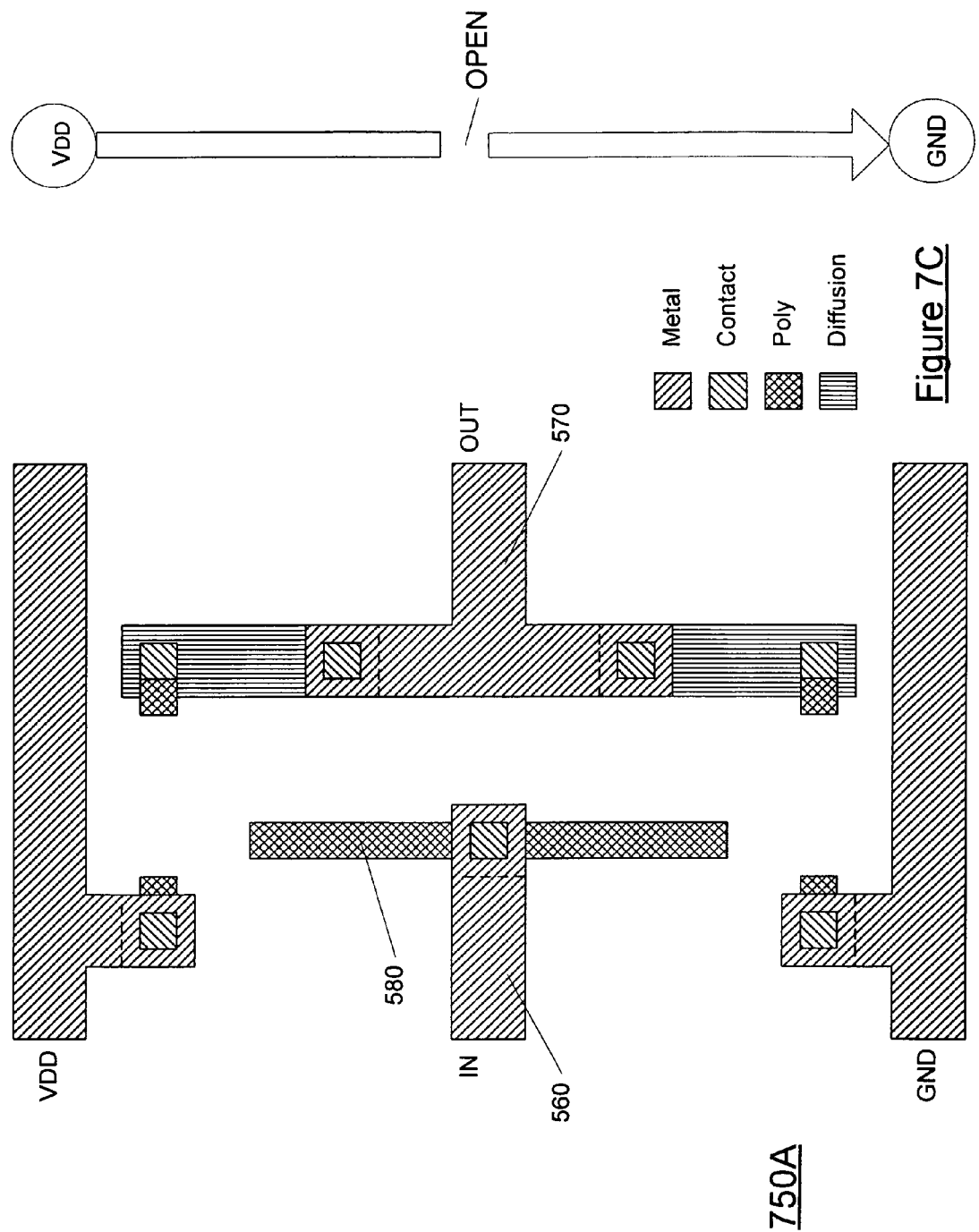
FIG. 7C represents the microcircuit structure of FIG. 7B without the removed components, but which does not causes the short circuit of FIG. 5C according to an embodiment of the invention.

FIG. 7C represents the microcircuit structure of FIG. 7B without the removed components, but which does not causes the short circuit of FIG. 5C according to an embodiment of the invention. Although microcircuit 750A is defective and thereby non-functional is does not interfere with the testing of other dice (especially those on the same reticle).

FIG. 7D represents a microcircuit structure 750D according to another embodiment of the invention. In this embodiment specialized conductive traces 790 are narrowed by etching to produce a significant resistance rather than an open circuit. As shown the specialized traces 790 have narrowed regions that may act as an equivalent current limiting resistor. Advantageously, the current may be sufficiently limited that testing of other microcircuits on the same reticle is not impacted by the performance of microcircuit 750D.

It will be apparent to those of ordinary skill in the art that various alternative but substantially equivalent topologies and placements are possible without changing the theory of operation of embodiments of the invention. For example, a disconnect link may be placed in series with a power source feeding the unsingulated die. Typically that power source may be a test circuit and the disconnect link may be created in series with the test circuit, or indeed may be embodied as a part of the test circuit itself.

FIG. 8 is a flowchart of a method 800 for manufacturing a semiconductor wafer according to an embodiment of the invention. In box 810 the method starts. In box 820 a polysilicon layer is formed at (on) a surface of the wafer by methods well-known in the art. In box 830, the polysilicon layer is etched to embody circuit elements such as may be rendered in a photomask. In embodiments of the invention these may typically include circuit elements of one or more application circuits and one or more conductive traces purposefully tailored to be narrowed, thinned and/or placed in judicious locations for high vulnerability to etching.

In optional box 840, each die is tested and in optional box 850 the wafer is singulated into dice. In box 890 the method ends.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A semiconductor wafer comprising a plurality of dice, comprising:
   a) at least a first die of said plurality of dice comprising its own conductive trace; and,
   b) a fixed voltage node of an on wafer test circuit coupled to said conductive trace, said on-wafer test circuit to support testing of said at least a first die during an on-wafer test sequence, said fixed voltage node to provide a fixed voltage to said at least a first die during said on-wafer test sequence, said at least a first die's conductive trace having a narrowed region in at least one section of said conductive trace such that said narrowed region has a smaller width than another region of said conductive trace that neighbors said narrowed region, said width of said narrowed region being greater than or substantially equal to a width of a transistor gate node within said at least a first die, said narrowed region located at a same layer as said transistor gate node.

2. The semiconductor wafer of claim 1 wherein:
said conductive trace is composed of polysilicon.

3. The semiconductor wafer of claim 1 wherein:
said conductive trace is selected from a group consisting of:
a power supply rail;
a ground rail; and,
an enable input.

4. The semiconductor wafer of claim 1 wherein:
said transistor gate is insufficiently formed as a consequence of overetching said transistor gate, said overetching during manufacturing occurring proximate to an edge of said wafer.

5. A semiconductor wafer, comprising: a conductive trace that couples a die to an on-wafer test circuit, said on-wafer test circuit to support testing of said die during an on-wafer test sequence, said conductive trace purposefully tailored to form an open circuit at a region of said conductive trace if a gate structure within said die is over etched during manufacturing, said gate structure being a conductive trace within said die, said region of said conductive trace having a narrowed width region, said narrowed width region having a width that is less than a width of another region of said conductive trace that neighbors said narrowed width region, said width of said narrowed width region being substantially equal to or greater than that of said gate structure.

6. The semiconductor wafer of claim 5 wherein:
said region is comprised of polysilicon and said gate structure is a gate of a transistor within said die.

7. The semiconductor wafer of claim 5 wherein:
said conductive trace is selected from a group consisting of:
a power supply rail;
a ground rail; and,
an enable input.

8. The semiconductor wafer of claim 5 wherein:
said over-etched during manufacturing occurs proximate to an edge of said wafer.

9. A semiconductor circuit comprising:
a conductive trace having a narrowed width region, said narrowed width region having a width that is less than a width of a region of said conductive trace that neighbors said narrowed width region, said width of said narrowed width region being substantially equal to a width of a gate of a transistor within said semiconductor circuit, said transistor to conduct a fixed voltage between its source and drain nodes, said width of said narrowed width region purposefully tailored to form an open circuit as a consequence of said transistor gate being overetched during manufacturing,
said conductive trace running to an open circuit at an edge of a die comprising said semiconductor circuit.

10. The semiconductor circuit of claim 9 wherein said conductive trace is comprised of polysilicon.

11. The semiconductor circuit of claim 9 wherein said conductive trace is to transport a fixed voltage during on-wafer testing of said semiconductor circuit.

12. A semiconductor wafer, comprising:
a surface;
a conductive rail formed on the surface, the conductive rail coupled to an on wafer test circuit to provide a supply voltage during on wafer testing;
a first transistor within an integrated circuit die, the first transistor coupled to the rail via a conductive trace having a narrowed width region, the narrowed width region having a width that is less than a width of another region of said conductive trace that neighbors said narrowed width region, said width of said narrowed width region being greater than or substantially equal to the first transistor's gate;
a second conductive rail, the second conductive rail coupled to the on wafer test circuit to provide a reference voltage during said on wafer testing; and
a second transistor within the integrated circuit die, the second transistor made similarly to the first transistor and coupled to the second conductive rail via a second conductive trace having a narrowed width region, the narrowed width region of the second conductive trace having a width that is less than a width of a region of said second conductive trace that neighbors said narrowed width region of said second conductive trace, said width of said narrowed width region of said second conductive trace being greater than or substantially equal to the second transistor's gate width.

13. The wafer of claim 12, wherein
the rail is one of a supply rail, a ground rail, and a signal rail.

14. The wafer of claim 12, further comprising:
a first plurality of additional transistors coupled to the rail via the conductive region.

15. The wafer of claim 12, wherein the surface has an edge and the conductive rail runs to the edge.

16. The wafer of claim 12, wherein
the trace includes metal.

17. The wafer of claim 12, wherein
the trace includes poly-silicon.

18. The wafer of claim 12 wherein
the rail runs along a saw street between two dice on the surface.

19. The wafer of claim 12 wherein
the wafer includes a plurality of tag circuits for RFID tags, and
the first and second transistors are part of the tag circuits.

* * * * *

UNITED STATES PATENT AND TRADEMARK OFFICE
CERTIFICATE OF CORRECTION

| | |
|---|---|
| PATENT NO. | : 7,667,231 B2 |
| APPLICATION NO. | : 11/336161 |
| DATED | : February 23, 2010 |
| INVENTOR(S) | : Hyde et al. |

It is certified that error appears in the above-identified patent and that said Letters Patent is hereby corrected as shown below:

Delete "overetching" on column 7, line 13 in claim 4 and insert --over-etching-- therefor.

Signed and Sealed this

Twenty-eighth Day of September, 2010

David J. Kappos
*Director of the United States Patent and Trademark Office*